United States Patent
Kasuga et al.

(10) Patent No.: US 7,271,834 B2
(45) Date of Patent: Sep. 18, 2007

(54) IMAGING DEVICE CHIP HAVING TRANSISTORS OF SAME CONDUCTIVITY TYPE AND IMAGE PICKUP SYSTEM

(75) Inventors: Shigetaka Kasuga, Hirakata (JP); Yoshiyuki Matsunaga, Kamakura (JP); Kazuyuki Inokuma, Yawata (JP)

(73) Assignee: Matsushita Electric Industrial Co., Ltd., Osaka (JP)

( * ) Notice: Subject to any disclaimer, the term of this patent is extended or adjusted under 35 U.S.C. 154(b) by 739 days.

(21) Appl. No.: 10/658,700

(22) Filed: Sep. 9, 2003

(65) Prior Publication Data

US 2004/0201732 A1 Oct. 14, 2004

(30) Foreign Application Priority Data

Sep. 17, 2002 (JP) ............... 2002-270604

(51) Int. Cl.
*H04N 5/335* (2006.01)
(52) U.S. Cl. ............. 348/308; 348/220.1; 348/294
(58) Field of Classification Search ............ 348/308, 348/230.1, 294, 296; 257/232
See application file for complete search history.

(56) References Cited

U.S. PATENT DOCUMENTS 6,441,441 B1 * 8/2002 Suda ................. 257/370
6,483,541 B1 * 11/2002 Yonemoto et al. .......... 348/302
6,518,999 B1 * 2/2003 Miyamoto ............... 348/220.1
6,985,181 B2 * 1/2006 Ewedemi et al. .......... 348/294
7,129,985 B1 * 10/2006 Koizumi et al. ........... 348/372

* cited by examiner

*Primary Examiner*—David Ometz
*Assistant Examiner*—Pritham Prabhakher
(74) *Attorney, Agent, or Firm*—Hamre, Schumann, Mueller & Larson, P.C.

(57) ABSTRACT

An imaging device chip set includes an imaging chip provided for obtaining an electric signal by photoelectric conversion of incident light, and a DSP chip provided for carrying out digital signal processing with respect to the electric signal obtained by the imaging chip. The imaging chip includes a plurality of unit pixels for generating the electric signal by the photoelectric conversion of incident light, a horizontal scanning circuit for selecting the unit pixels in a horizontal direction, and a vertical scanning circuit for selecting the unit pixels in a vertical direction. The DSP chip includes a timing generating circuit for generating timing pulses necessary for operations of the horizontal scanning circuit and the vertical scanning circuit, and a digital signal processing circuit for carrying out digital signal processing with respect to the electric signal generated by the plurality of unit pixels. The timing generating circuit and the digital signal processing circuit, which are included in the DSP chip, are formed with CMOS transistors. The plurality of unit pixels, the horizontal scanning circuit, and the vertical scanning circuit, which are included in the imaging chip, are formed with transistors of the same conductivity type.

8 Claims, 5 Drawing Sheets

IMAGING DEVICE CHIP HAVING TRANSISTORS OF SAME CONDUCTIVITY TYPE AND IMAGE PICKUP SYSTEM

BACKGROUND OF THE INVENTION

1. Field of the Invention

The present invention relates to an imaging device chip set and an image pickup system for use in a digital camera, etc., and particularly to an imaging device chip set and an image pickup system in each of which a MOS-type imaging chip and a DSP chip are included.

2. Related Background Art

Recently, rapid-paced advances of the digital signal processing technology and the CMOS micromachining technology have made it possible to provide a one-chip CMOS camera in which a digital signal processor (DSP) capable of performing high-level signal processing operations and an imaging element that converts optical signals projected to an imaging surface into electric signals and takes out the same are integrated on one silicon substrate.

FIG. 7 is a view illustrating a configuration of a conventional one-chip CMOS camera 80. The one-chip CMOS camera 80 includes a sensor part 207 that converts light into electric signals. In a sensor part 207, a plurality of unit pixels 1 are arranged in matrix. The CMOS camera 80 includes a vertical scanning circuit 205, a horizontal scanning circuit 206, and a timing generating circuit 203 for driving the unit pixels 1 arranged in the sensor part 207. The CMOS camera 80 includes a gain control amplifier 204 for amplifying signal outputs from the unit pixels 1 arranged in the sensor part 207, an analog digital converting circuit 208 for converting output signals from the gain control amplifier 204 into digital signals, and a digital signal processing circuit 202 for performing digital signal processing with respect to digital signals obtained through the conversion by the analog-digital converting circuit 208.

While the one-chip configuration has been enabled by the CMOS micromachining technology that has advanced highly, it has been found that a two-chip configuration in which the imaging chip and the DSP chip are formed independently has advantages in performance and cost.

A DSP chip has a more sophisticated signal-processing function for carrying out high-level signal processing with respect to an enormous volume of image information. In the case of still images, it is necessary to compress the image information greatly so as to transmit images through portable telephones that will progress significantly from now on. More specifically, for this purpose, a compressing method called JPEG is available. To compress data by JPEG, it is necessary to perform an enormous amount of calculation at a high speed. Therefore, the CMOS micromachining technology and the latest CMOS circuit designing technology are indispensable. Further, in the case where motion pictures are handled ultra-high-speed processing circuits are required. Thus, a DSP chip necessarily uses the most advanced digital CMOS micromachining technology.

On the other hand, an imaging chip deals with analog signals. Further, the miniaturization of a photosensitive region arranged in an imaging chip cannot be promoted rapidly due to limitations relating to lenses used in cameras. Thus, the manufacturing processes required for the DSP chip and the imaging chip are different. If the chips are arranged on one chip by brute force combination, there is a possibility of deteriorating the performance of the imaging chip that is arranged in one chip together with the DSP, due to the higher speed of the DSP, the micromachining process used as the manufacturing process, and digital noises of the DSP. Therefore, the configuration in which the imaging chip and the DSP chip are arranged independently has an advantage.

FIG. 8 is a block diagram illustrating a configuration of another conventional imaging device chip set 90. The imaging device chip set 90 includes an imaging chip 210 and a DSP chip 211. The imaging device chip set 90 in which the imaging chip 210 and the DSP chip 211 are arranged independently is configured so that, irrespective of the signal processing method and the type of the DSP, a vertical scanning circuit 205 and a horizontal scanning circuit 206 for driving a sensor part 207, a timing pulse generating circuit 203 for generating pulses necessary for the vertical scanning circuit 205 and the horizontal scanning circuit 206, a gain control amplifier 204 for amplifying a signal output from the sensor part 207, and an analog-digital converting circuit 208 for converting an output signal from the gain control amplifier 204 to a digital signal are mounted on an imaging chip 210, so as to cause the imaging chip to operate independently. A digital signal processing circuit 98 is mourned on a DSP chip 211.

A reference pulse is supplied from the DSP chip 211 to the imaging chip 210 via a master clock line 212. Further, an electronic shutter signal is supplied from the DSP chip 211 to the imaging chip 210 via an electronic shutter signal line 213 for controlling sensitivity. From the imaging chip 210 to the DSP chip 211, a digital signal from the analog-digital converting circuit 205 is supplied to the digital signal processing circuit 98 via a signal line 214.

In the two-chip configuration that the above-described conventional technology proposes with a view to achieving the lower cost and the higher performance, the added value of the DSP chip relating to the performance and the cost are increased by employing the CMOS micromachining technology and incorporating the digital signal processing technology that has been advancing rapidly. However, for the imaging chip, a modest micromachining technology has to be used so as to ensure analog performance, and this increases the area of the digital circuits such as the timing pulse generating circuit 203, which inherently are formed with CMOS logics advantageously. Consequently, the two-chip configuration has not achieved any great advantage in the cost aspect, as compared with the one-chip configuration.

By mounting the timing pulse generation circuit 203, the gain control amplifier 204, and the analog-digital converting circuit 208 on the DSP chip 211, it is possible to attempt to reduce the cost. However, in this case, the number of lines for supplying timing pulses from the DSP chip 211 to the imaging chip 210 increases, and noises are superposed on the supply lines, whereby the noises are superposed on a noise output of the imaging chip 210. As a result, the sensitivity of the imaging chip 210 decreases, thereby leading to the degradation of the performance. It has been known that the noises are generated due to fluctuations of current supplied to the vertical scanning circuit 205 and the horizontal scanning circuit 206 for mainly driving the sensor part 207.

In the case where the vertical scanning circuit 205 and the horizontal scanning circuit 206 are formed with CMOS logics, the current fluctuations are caused by a so-called flow-through current that is generated upon the switching of the CMOS circuits. It is also known that generally, a CMOS circuit is characterized by small power consumption, but a great current (flow-through current) flows at the moment of switching of the CMOS circuit. This is because only at an instant upon the switching, both of n-MOS and p-MOS transistors are turned ON, which causes a short circuit between a power source and a ground. In the case where a line for controlling the switching is arranged outside the chip, noises are superposed on the line itself, or pulses passing through the line are dulled, thereby increasing noises of the power source due to the flow-through current. Therefore, the earlier possible establishment of the two-chip configuration system technology with which requirements of the lower cost and the higher performance are satisfied is being demanded.

An object of the present invention is to provide an imaging device chip set and an image pickup system in which both of the imaging chip and the DSP chip have an increased added value.

SUMMARY OF THE INVENTION

An imaging device chip set according to the present invention includes an imaging chip provided for obtaining an electric signal by photoelectric conversion of incident light, and a DSP chip provided for carrying out digital signal processing with respect to the electric signal obtained by the imaging chip. The imaging chip includes a plurality of unit pixels for generating the electric signal by the photoelectric conversion of incident light, a horizontal scanning circuit for selecting the unit pixels in a horizontal direction, and a vertical scanning circuit for selecting the unit pixels in a vertical direction. The DSP chip includes a timing generating circuit for generating timing pulses necessary for operations of the horizontal scanning circuit and the vertical scanning circuit, and a digital signal processing circuit for carrying out digital signal processing with respect to the electric signal generated by the plurality of unit pixels. The timing generating circuit and the digital signal processing circuit, which are included in the DSP chip, are formed with CMOS transistors. The plurality of unit pixels, the horizontal scanning circuit, and the vertical scanning circuit, which are included in the imaging chip, are formed with transistors of the same conductivity type.

An image pickup system according to the present invention includes: the imaging device chip set according to the present invention; a memory that stores function information for executing functions including an electronic shutter and an automatic diaphragm; and a controller for reading out the function information stored in the memory, and feeding the same to the DSP chip provided in the imaging device chip set.

DETAILED DESCRIPTION OF THE INVENTION

Figure 1:
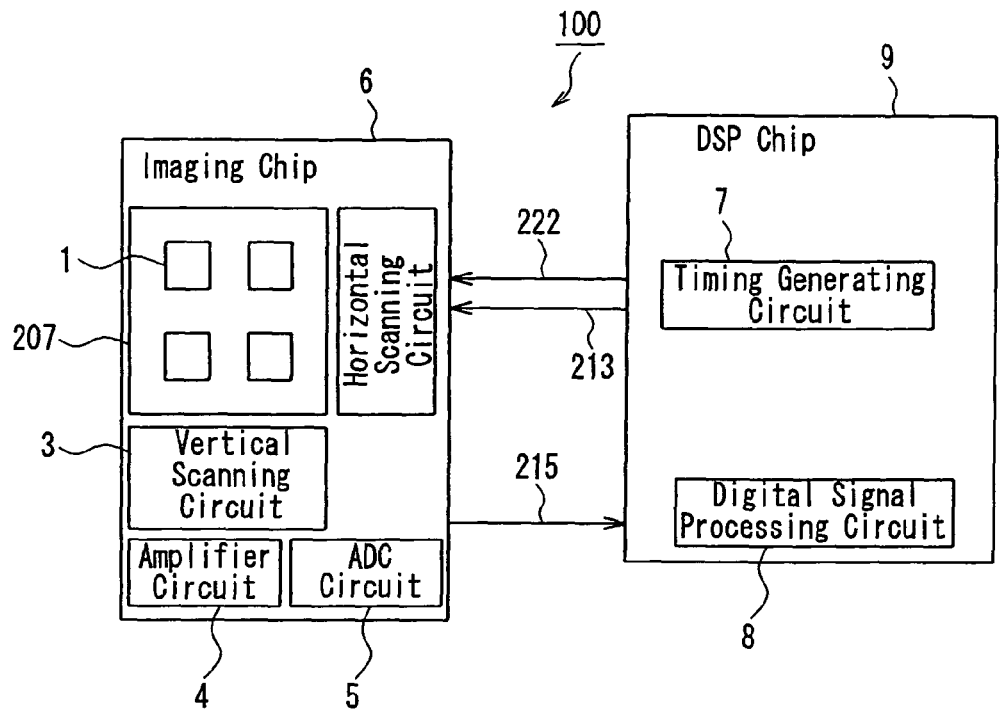
FIG. 1 is a block diagram illustrating a configuration of an imaging device chip set according to an embodiment of the present invention.

In the imaging device chip set according to an embodiment of the present invention, a plurality of unit pixels, a horizontal scanning circuit, and a vertical scanning circuit that are included in an imaging chip are formed with transistors of the same conductivity type. Therefore, well structures of only one type may be produced in a diffusion step for producing the imaging chip. As a result, it is possible to significantly reduce the number of steps in the process for producing the imaging chip, and the number of masks used therein.

The plurality of unit pixels, the horizontal scanning circuit, and the vertical scanning circuit, which are included in the imaging chip, preferably are formed with n-MOS transistors.

The transistors of the same conductivity type that form the plurality of unit pixels, the horizontal scanning circuit, and the vertical scanning circuit, which are included in the imaging chip, preferably are formed according to a minimum dimension greater than a minimum dimension for forming the CMOS transistors that form the timing generating circuit and the digital signal processing circuit included in the DSP chip.

At least a part of the horizontal scanning circuit and vertical scanning circuit included in the imaging chip preferably is formed with dynamic logic circuits.

The imaging chip preferably further includes: an amplifier circuit for amplifying the electric signal generated by the plurality of unit pixels; and an analog-digital converting circuit for converting the electric signal amplified by the amplifier circuit into a digital signal and feeding the same to the digital signal processing circuit included in the DSP chip.

The plurality of transistors forming the dynamic logic circuits preferably are isolated from one another with thick oxide films formed on a substrate.

The plurality of transistors forming the dynamic logic circuits preferably are isolated from one another with ion-implanted layers, the ion-implanted layers being formed so as to be exposed on a surface of a substrate.

Each of the unit pixels included in the imaging chip preferably includes an embedded-type photodiode that is formed so as to be exposed on a surface of a substrate.

The following will describe an embodiment of the present invention while referring to the drawings.

FIG. 1 is a block diagram illustrating a configuration of an imaging device chip set 100 according to the present embodiment. The imaging device chip set 100 includes an imaging chip 6 that is provided for obtaining electric signals by photoelectric conversion of incident light, and a DSP chip 9 that is provided for carrying out digital signal processing with respect to the electric signals obtained by the imaging chip 6. The imaging chip 6 includes a sensor part 207. The sensor part 207 has a plurality of unit pixels 1 arranged in matrix, which generate electric signals by photoelectric conversion of incident light. Each unit pixel 1 includes an embedded-type photodiode that is formed so as to be exposed on a surface of a substrate. The imaging device chip set 100 includes a horizontal scanning circuit 2 for selecting the unit pixels 1 in a horizontal direction, and a vertical scanning circuit 3 for selecting the unit pixels 1 in a vertical direction.

The plurality of unit pixels 1, the horizontal scanning circuit 2, and the vertical scanning circuit 3 are formed with n-MOS transistors. Thus, a plurality of the unit pixels 1, the horizontal scanning circuit 2, and the vertical scanning circuit 3, which are included in the imaging chip 6, are formed with transistors of the same conductivity type.

At least a part of the horizontal scanning circuit 2 and the vertical scanning circuit 3 is formed with dynamic logic circuits. A plurality of transistors composing the dynamic logic circuits are isolated from one another with thick oxide films arranged therebetween on the substrate. The plurality of transistors composing the dynamic logic circuits may be isolated from one another with ion-implanted layers arranged therebetween on the substrate, the ion-implanted layers being formed so as to be exposed on the surface of the substrate.

The DSP chip 9 includes a timing generating circuit 7 for generating timing pulses necessary for the operations of the horizontal scanning circuit 2 and the vertical scanning circuit 3 provided on the imaging chip 6, and a digital signal processing circuit 8 for performing digital signal processing with respect to electric signals generated by the plurality of unit pixels 1. The timing generating circuit 7 and the digital signal processing circuit 8 included in the DSP chip 9 are formed with CMOS transistors.

The imaging chip 6 further includes an amplifier circuit 4 for amplifying electric signals generated by the plurality of the unit pixels 1, and an analog-digital converting circuit 5 for converting the electric signals amplified by the amplifier circuit 4 into digital signals and supplying the digital signals to the digital signal processing circuit 8 included in the DSP chip 9.

Figure 8:
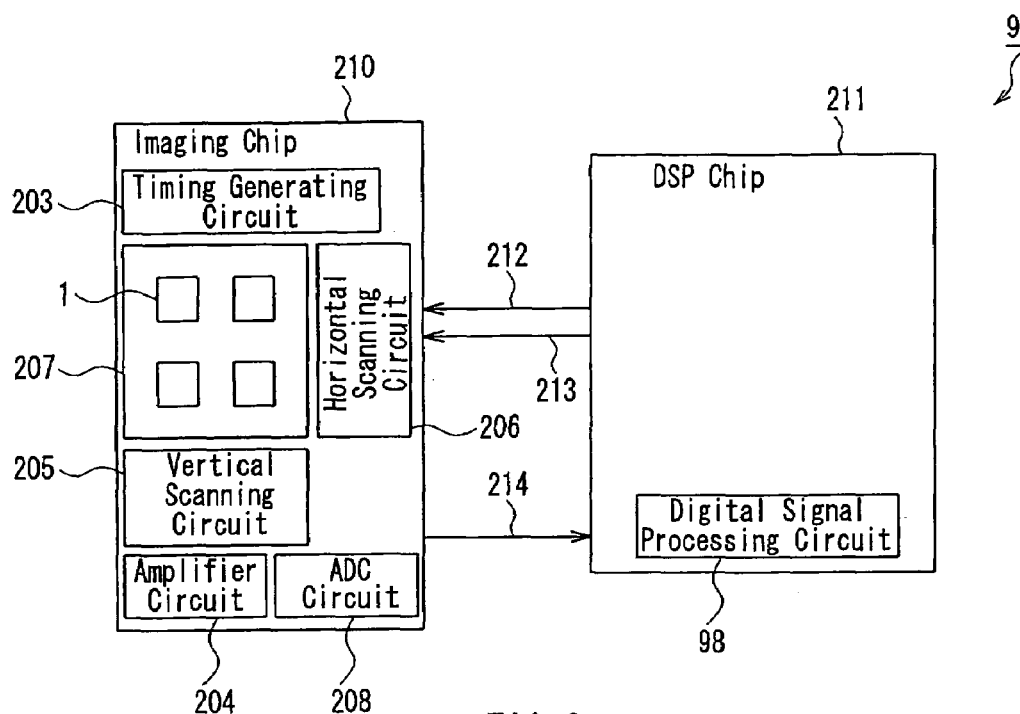
FIG. 8 is a block diagram illustrating a configuration of a second conventional imaging device chip set.

Unlike the master clock line 212 in the prior art described above with reference to FIG. 8, a plurality of timing supply lines 222 are provided for supplying timing pulses from the timing generating circuit 7 provided on the DSP chip 9 to the horizontal scanning circuit 2 and the vertical scanning circuit 3 provided on the imaging chip 6.

In the case where thus a plurality of the timing supply lines 222 are arranged outside the imaging chip 6 and the DSP chip 9, noises tend to be superposed on the timing supply lines 222. The noises fluctuate the currents of timing pulses supplied to the horizontal scanning circuit 2 and the vertical scanning circuit 3. Therefore, the fluctuation of the currents of the timing pulses is superposed on a noise output of the imaging chip 6. As a result, there is a possibility of degradation of the sensitivity of the imaging chip 6.

However, the horizontal scanning circuit 2 and the vertical scanning circuit 3 provided on the imaging circuit 6 according to the present embodiment are formed with n-MOS transistors, that is, transistors of the same conductivity type, and at least a part of the horizontal scanning circuit 2 and the vertical scanning circuit 3 is formed with dynamic logic circuits. Therefore, current fluctuations of the timing pulses do not occur. Therefore, the sensitivity of the imaging chip 6 is not affected adversely. Further, in the case where the whole circuits provided on the imaging chip 6 are formed with either n-MOS transistors alone or p-MOS transistors alone, it is possible to further improve the imaging characteristics. This is described below in more detail.

Figure 9:
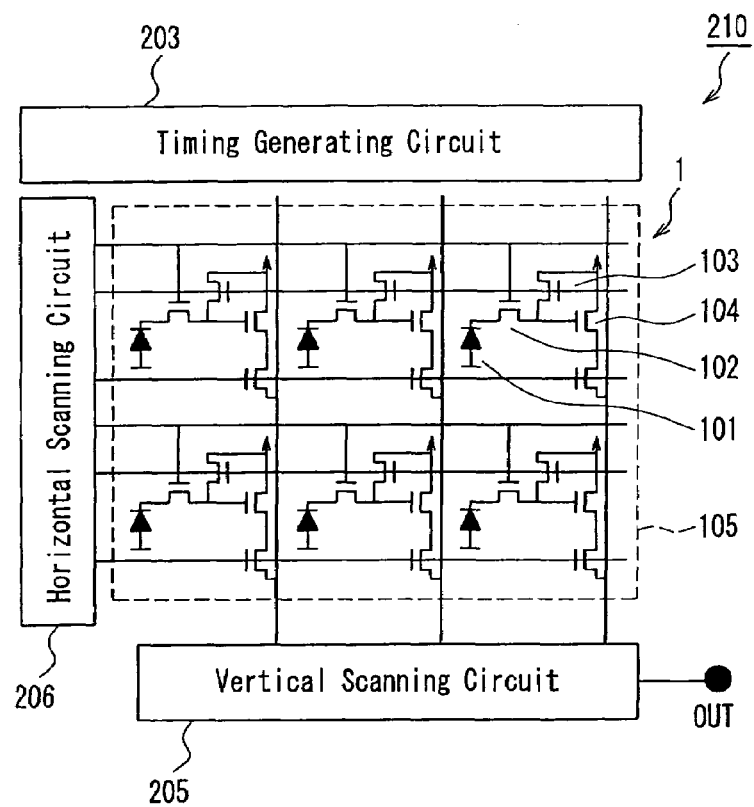
FIG. 9 is a circuit diagram illustrating a principal configuration of an imaging chip provided in the second conventional imaging device chip set.

First of all, problems that have arisen in a conventional CMOS imaging sensor are described here. FIG. 9 is a circuit diagram illustrating a configuration of principal parts of the imaging chip 210 provided in a conventional imaging device chip set 90. Each unit pixel 1 includes a photodiode 101, a transfer transistor 102, a reset transistor 103, and an amplifier transistor 104.

A vertical scanning circuit 205, a horizontal scanning circuit 206, and a timing generating circuit 203 are formed with CMOS transistors in which both of n-MOS transistors and p-MOS transistors are used. On the other hand, all of the transfer-transistor 102, the reset transistor 103, and the amplifier transistor 104 that compose each unit pixel 1 are formed with n-MOS transistors. The n-MOS transistors composing the transfer transistor 102, the reset transistor 103, and the amplifier transistor 104 have the same configuration as that of the n-MOS transistors composing the vertical scanning circuit 205, the horizontal scanning circuit 206, and the timing generating circuit 203.

An amplifier-type sensor such as a CMOS image sensor is capable of amplifying a small signal, thereby having a characteristic of high sensitivity. Therefore, if a great leakage current leaks into the photodiode 101, great noises are generated since the sensor amplifies the leakage current.

The transistors composing each unit pixel 1 are of the same types as those of the transistors composing the vertical scanning circuit 205, the horizontal scanning circuit 206, and the timing generating circuit 203, which are CMOS transistors each of which includes a p-MOS transistor and a n-MOS transistor, which have been developed in the tide of the semiconductor LSI micromachining technology.

Here, a higher speed is required of a CMOS transistor produced by micromachining, and the manufacture of transistors is adapted for the purpose of achieving a higher speed. Therefore, an attempt to cope with the leakage current generated from element-isolating regions and the vicinities of the same is made actually only to an extent such that logic operations do not have problems. Accordingly, if the n-MOS transistors composing the vertical scanning circuit 205, the horizontal scanning circuit 206, and the timing generating circuit 203 are used without any change for forming the amplifier-type unit pixel 1, noises due to leakage current increase significantly. As a result, there arises a problem that the quality of images displayed by the plurality of unit pixels 1 would deteriorate.

Figure 10:
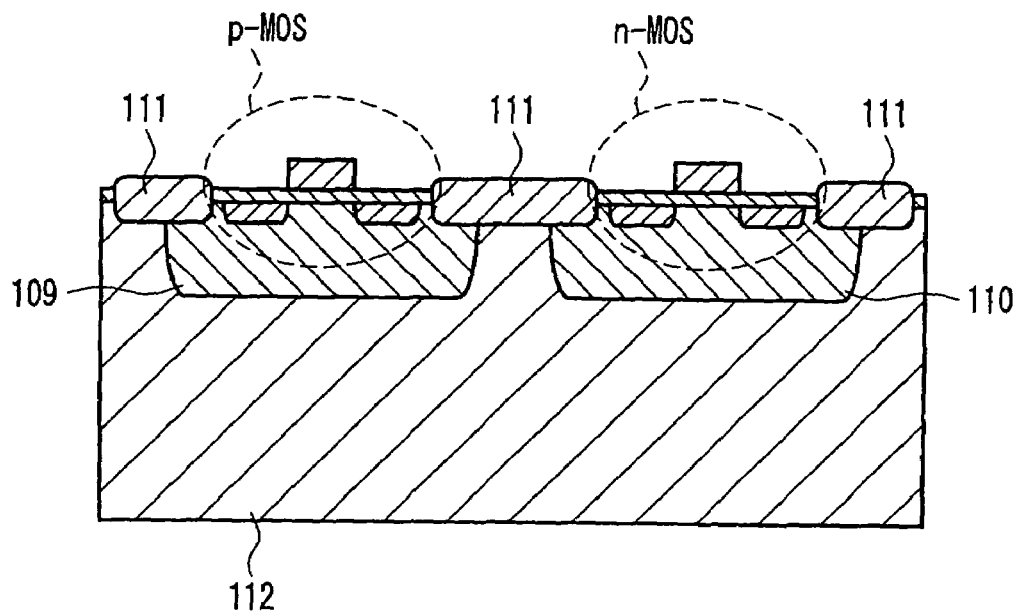
FIG. 10 is a cross-sectional view illustrating a configuration of a CMOS transistor provided in the second conventional imaging device chip set.
Figure 11:
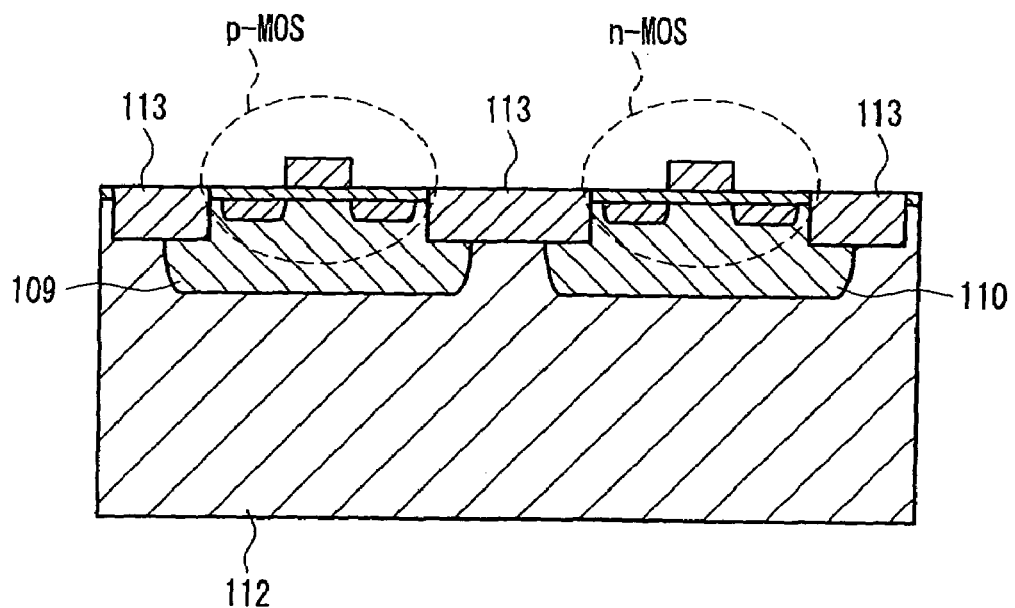
FIG. 11 is a cross-sectional view illustrating a configuration of another CMOS transistor provided in the second conventional imaging device chip set.

The following describes a mechanism in which such leakage current is generated, while referring to FIGS. 10 and 11 that illustrate configuration examples of such a CMOS transistor. FIG. 10 is a cross-sectional view illustrating a configuration of a CMOS transistor provided on the unit pixel 1 of the conventional imaging device chip set 90.

Transistors composing the unit pixel 1 are formed on a silicon semiconductor substrate 112. In the silicon semiconductor substrate 112, a n-type well 109 and a p-type well 110 are formed so that they are exposed on a surface of the silicon substrate 112.

The p-MOS transistor is formed on the n-type well 109, while a n-MOS transistor is formed on the p-type well 110. On the silicon semiconductor substrate 112, LOCOS 111 formed with oxide films as element isolation regions for isolating the p-MOS transistor and the n-MOS transistor from each other are formed so that the LOCOS 111 are embedded approximately to half of their thickness in the silicon semiconductor substrate 112. In each region where the LOCOS 111 is embedded approximately to half in the silicon semiconductor substrate 112, significant stress occurs. Therefore, this causes great leakage current to be generated.

FIG. 11 is a cross-sectional view illustrating another configuration of a CMOS transistor provided on the unit pixel 1 of the conventional imaging device chip set 90. The same constituent elements as those described above with reference to FIG. 10 are designated with the same reference numerals, and detailed descriptions of these constituent elements are omitted.

STI (shallow trench isolation) 113 as element isolation regions for isolating a p-MOS transistor and a n-MOS transistor from each other are formed in the silicon semiconductor substrate 112 so as to be exposed on a surface of the silicon semiconductor substrate 112.

In the case where the miniaturization of the CMOS is promoted further, the STI 113 are used. Since a whole of the thick oxide film forming each STI 113 is embedded in the silicon semiconductor substrate 112, a further greater leakage current than that of the case of the element isolation by the LOCOS 111 described occurs.

Figure 2:
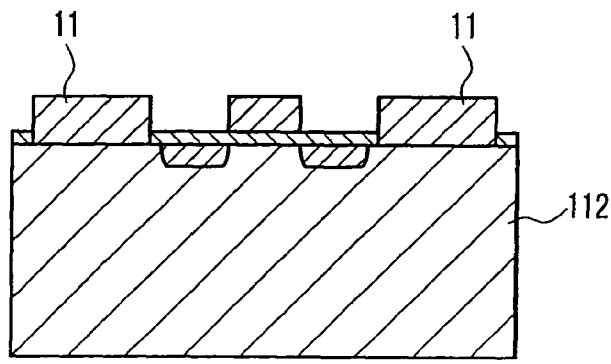
FIG. 2 is a cross sectional view illustrating a configuration of a n-MOS transistor provided in a horizontal scanning circuit of the imaging device chip set according to the embodiment.

In contrast, an element isolation structure with decreased leakage current is proposed. FIG. 2 is a cross-sectional view illustrating a configuration of element isolation for isolating n-MOS transistors provided on the horizontal scanning circuit 2 of the imaging device chip set 100 according to the present embodiment. On the silicon semiconductor substrate 112, element isolation oxide films 11 for isolating n-MOS transistors from one another are formed so as to be in contact with a surface of the silicon semiconductor substrate 112. Each element isolation oxide film 11 is formed with a thick oxide film. Since the element isolation oxide film 11 is not wedged into the silicon semiconductor substrate 112, the leakage current can be reduced.

With the configuration shown in FIG. 2, though pulses transmitted in a scanning circuit formed with either n-MOS transistors alone or p-MOS transistors alone sometimes exceed a power source voltage due to boosting, the breakdown resistance can be ensured even in such a case since the element isolation oxide films 11 are thick.

Figure 3:
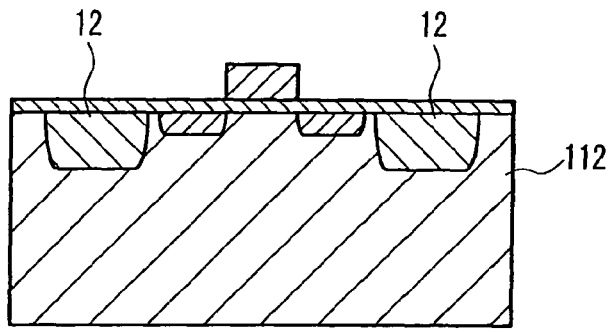
FIG. 3 is a cross-sectional view illustrating another configuration of a n-MOS transistor provided in a horizontal scanning circuit of the imaging device chip set according to the embodiment.

FIG. 3 is a cross-sectional view illustrating another configuration of element isolation for isolating n-MOS transistors provided on the horizontal scanning circuit 2 of the imaging device chip set 100 according to the present embodiment. Ion implanted layers 12 for isolating n-MOS transistors from one another are formed on the silicon semiconductor substrate 112 so as to be exposed on the surface of the silicon semiconductor substrate 112. Since each ion-implanted layer 12 is formed by implanting ions, it is possible to reduce leakage current. The element isolation may be configured by using the element isolation oxide films 11 shown in FIG. 2 and the ion-implanted layers 12 shown in FIG. 3 together in combination.

It is possible to use such an element isolation structure causing decreased leakage current as those described above with reference to FIGS. 2 and 3 in each unit pixel 1. However, in the case where such an element separation structure causing decreased leakage current is formed between CMOS transistors, the characteristics of the CMOS transistors are changed. Therefore, this makes the CMOS transistor configuration that has been developed through a long period of time inapplicable, thereby making it meaningless to use the CMOS transistors.

Therefore, it would be proposed to form an element isolation structure that causes greater leakage current, such as those shown in FIGS. 10 and 11, in circuits that operate with logics, such as the vertical scanning circuit 3 and the horizontal scanning circuit 2, while forming an element isolation structure that causes smaller leakage current, such as those shown in FIGS. 2 and 3, in each unit pixel 1. However, such a configuration requires a complex and long manufacturing process, thereby leading to an increase in the cost and an increase in the time until products are supplied. Further, it also requires the control of three types of transistor characteristics, that is, p-MOS transistors and n-MOS transistors composing the CMOS transistors, and n-MOS transistors composing the unit pixels 1. Therefore, it is impossible to increase the value per an area of an imaging device chip set.

The imaging chip 6 provided on the imaging device chip set 100 provided according to the present embodiment is characterized in that the imaging chip 6 is formed with only n-MOS transistors and p-MOS transistors. For instance, the n-MOS transistors with the element isolation structure that causes smaller leakage current being formed, such as those shown in FIGS. 2 and 3, are used as transistors composing each unit pixel 1, while the n-MOS transistors with the element isolation structure that causes smaller leakage current being formed, such as those shown in FIG. 2, are used for forming the vertical scanning circuit 3 and the horizontal scanning circuit 2. By so doing, the leakage current can be reduced. Consequently, the quality of images obtained with use of the imaging device chip set 100 can be improved dramatically.

On the other hand, there arises a new problem that the power consumption increases in the case where the vertical scanning circuit 3 and the horizontal scanning circuit 2 are formed with only n-MOS transistors. To cope with this problem, a dynamic circuit is employed, so that the reduction of the power consumption is achieved with a configuration of only n-MOS transistors.

Figure 4:
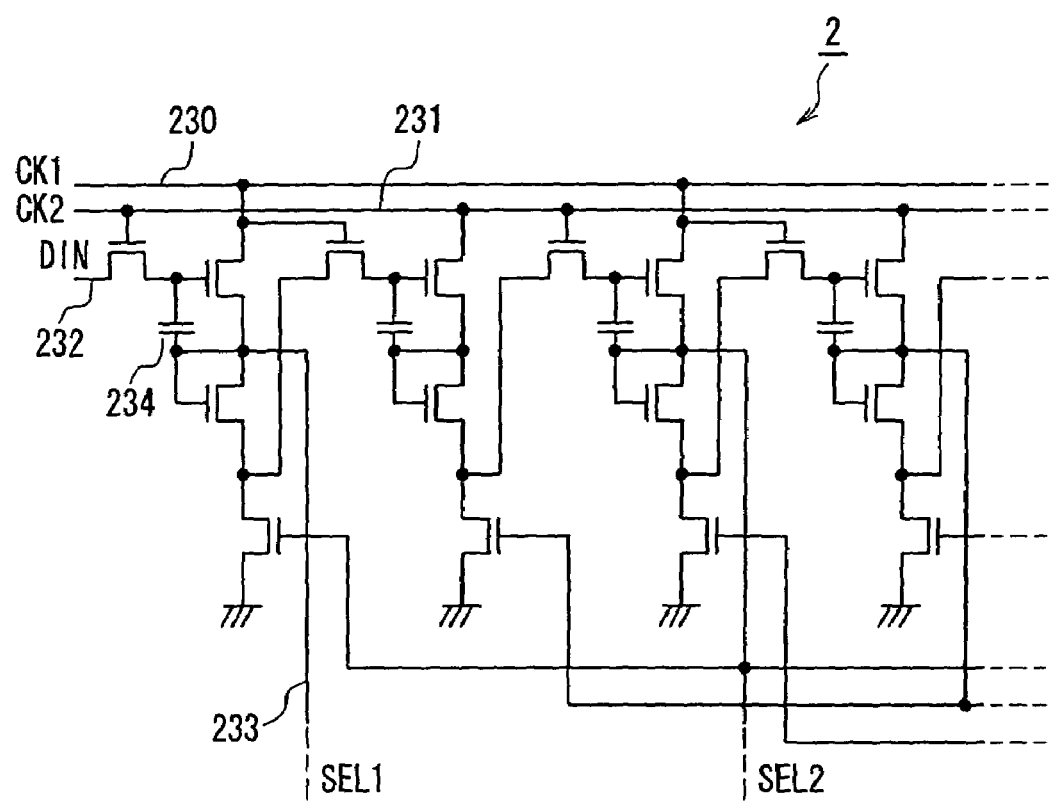
FIG. 4 is a circuit diagram illustrating a configuration of a horizontal scanning circuit provided in the imaging device chip set according to the embodiment.

FIG. 4 is a circuit diagram illustrating a configuration of the horizontal scanning circuit 2 provided on the imaging device chip set 100 according to the present embodiment. FIG. 4 shows an example of a n-MOS dynamic shift register circuit that is applicable as the vertical scanning circuit 3 or the horizontal scanning circuit 2. The dynamic circuit dynamically holds data in capacitors 234. Therefore, if the leakage current is great, data are destroyed by the leakage current. As a result, the dynamic circuit malfunctions. To avoid such breakdown due to leakage current, it is necessary to use transistors that cause small leakage current. For this purpose also, it is rational to form the vertical scanning circuit 3 and the horizontal scanning circuit 2 with the MOS transistors shown in FIG. 2, which are isolated from one another with the element isolation oxide films 11 arranged therebetween, which cause a smaller leakage current.

The reason why the element isolation with the use of the ion-implanted layers 12 shown in FIG. 3 is not used in the vertical scanning circuit 3 and the horizontal scanning circuit 2 is as follows. If the element isolation with the use of the ion-implanted layers 12 as shown in FIG. 4 is formed in the vertical scanning circuit 3 and the horizontal scanning circuit 2 as peripheral circuits other than the unit pixels 1, gate electrodes are formed on a thin gate insulation film. This causes the gate electrodes to have greater capacitances, thereby decreasing the speeds of the circuits. Further, this also causes other problems such as defects of short circuits with the semiconductor substrate 112.

Figure 5:
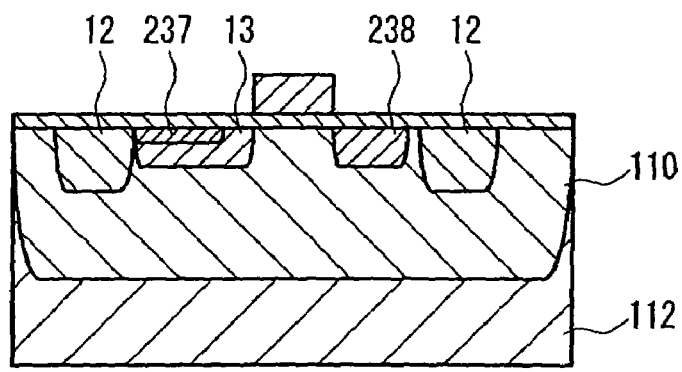
FIG. 5 is a cross-sectional view illustrating a configuration of an embedded-type photodiode embedded in each unit pixel of the imaging device chip set according to the embodiment.

FIG. 5 is a cross-sectional view illustrating a configuration of an embedded-type photodiode provided in each unit pixel 1 of the imaging device chip set 100 according to the present embodiment. Referring to FIG. 5, a floating diffusion part 238 that is a diffusion layer and a photodiode 13 are formed between the element isolation structures formed with the ion-implanted layers 12 as shown in FIG. 3, and a P-type embedded layer 237 is formed in the photodiode 13.

In the case where the imaging chip 6 is formed with n-MOS transistors alone or p-MOS transistors alone, a specific manufacturing process for forming such an embedded-type photodiode 13 can be used, whereby the reduction of leakage current on the surface of the photodiode 13 can be achieved.

As described above, by forming the circuitry of the imaging chip 6 with either n-MOS transistors alone or p-MOS transistors alone, the imaging chip 6 is made more resistant against noises of pulses inputted from outside, due to the dynamic logic. Further, by forming the element isolation structure that causes a smaller leakage current, drastic improvement of the imaging characteristics can be expected. Further, the manufacturing process is shortened and a great advantage is achieved in the cost aspect, irrespective of the CMOS process.

Thus, it is possible to provide an imaging device chip set that achieves a greater advantage than the conventional one-chip system and the conventional two-chip system in both aspects of the performance and the cost.

As described above, according to the present embodiment, the plurality of unit pixels 1, the horizontal scanning circuit 2, and the vertical scanning circuit 3, which are included in the imaging chip 6, are formed with transistors of the same conductivity type. Therefore, in a diffusion step for producing the imaging chip 6, well structures of only one type may be produced. As a result, it is possible to significantly reduce the number of steps of the process for producing the imaging chip 6 and the number of masks used therein.

With this configuration, it is possible to provide an imaging device chip set that satisfies the requirements of the lower cost and the higher performance. In other words, to achieve the lower cost, all the circuits formed in the imaging chip that is configured independently from the DSP chip are formed with either n-MOS transistors alone or p-MOS transistors alone. To produce the imaging chip thus configured, well structures of only one type are formed in the diffusion step. Therefore, the number of the steps in the process and the number of masks used can be decreased significantly. Furthermore, it is unnecessary to use the micromachining process in accordance with the DSP chip. As to the higher performance, it is possible to configure the imaging chip so that priority is placed on the analog performance, independently from the DSP chip. Therefore, an inappropriate micromachining process is not used, thereby allowing for the higher performance.

Figure 6:
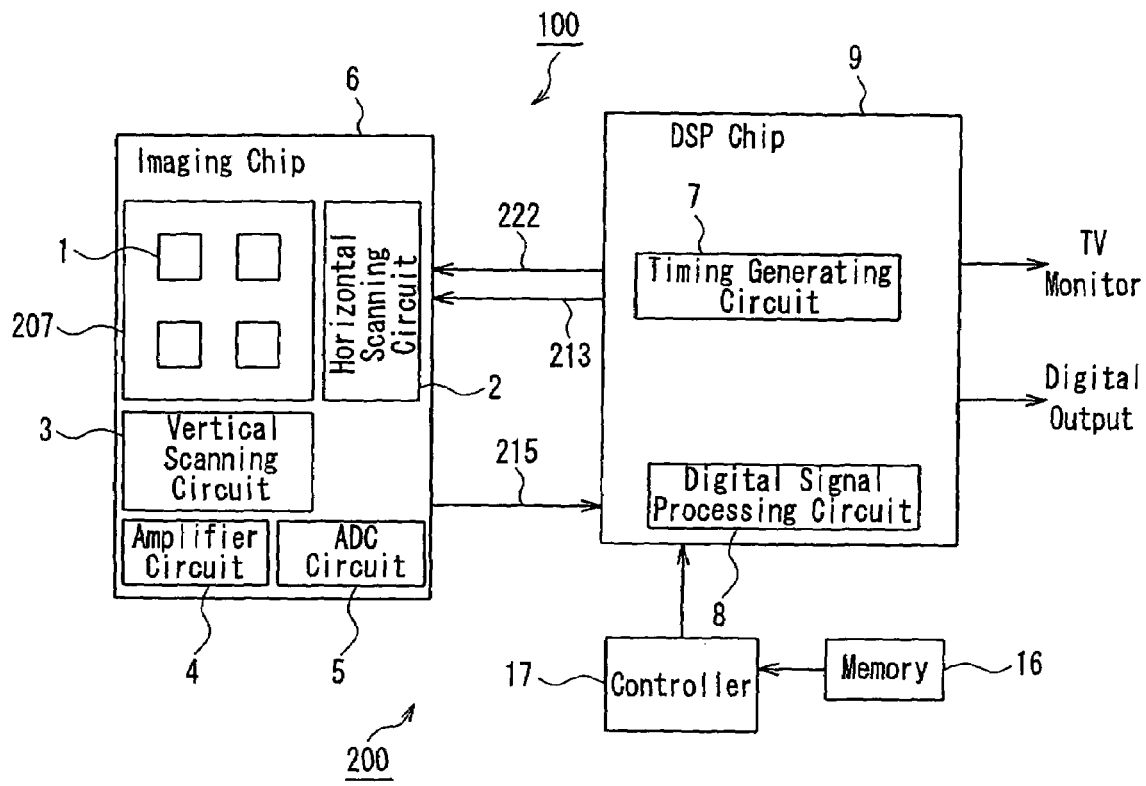
FIG. 6 is a block diagram illustrating a configuration of an image pickup system according to the embodiment.
Figure 7:
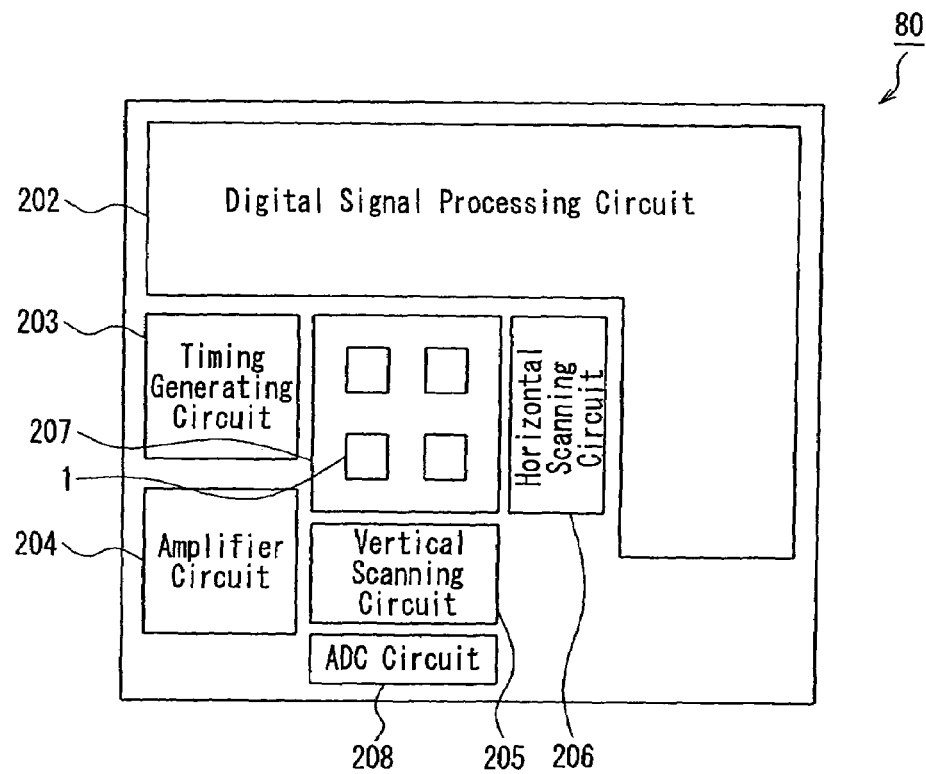
FIG. 7 is a block diagram illustrating a configuration of a conventional imaging device chip set.

FIG. 6 is a block diagram illustrating a configuration of an image pickup system 200 according to the present embodiment. The same constituent elements as those described above with reference to FIG. 1 are designated with the same reference numerals, and detailed descriptions of these constituent elements are omitted.

The image pickup system 200 includes the imaging device chip set 100 according to the present embodiment. The image pickup system 200 has a memory 16 that stores function information for executing functions including an electronic shutter and an automatic diaphragm, and a controller 17 that reads out the function information stored in the memory 16 and feeds the same to the DSP chip 9 provided in the imaging device chip set 100. The memory 16 is composed of an EEPROM.

Thus, by employing the imaging device chip set 100 according to the present embodiment in the image pickup system 200, it is possible to improve the image quality of the image pickup system such as a digital still camera, a surveillance camera, a fingerprint recognition system, etc.

As described above, according to the present embodiment, it is possible to increase the value of the imaging chip per chip area, without impairing the significant increase of the added value of the DSP chip. Further, by incorporating the imaging device chip set in an image pickup system, the added value of the image pickup system dramatically is increased. Thus, by independently configuring the DSP chip that needs to be miniaturized because of its characteristics and functions and the imaging chip whose priority is in the imaging performance rather than in the miniaturization, it is possible to increase the added values of the DSP chip and the imaging chip both, and to provide an imaging device chip set whose cost is reduced greatly.

The invention may be embodied in other forms without departing from the spirit or essential characteristics thereof. The embodiments disclosed in this application are to be considered in all respects as illustrative and not limiting. The scope of the invention is indicated by the appended claims rather than by the foregoing description, and all changes which come within the meaning and range of equivalency of the claims are intended to be embraced therein.

What is claimed is:

1. An imaging device chip set comprising:
    an imaging chip provided for obtaining an electric signal by photoelectric conversion of incident light; and
    a DSP chip provided for carrying out digital signal processing with respect to the electric signal obtained by the imaging chip,
    wherein
    the imaging chip includes:
        a plurality of unit pixels for generating the electric signal by the photoelectric conversion of incident light;
        a horizontal scanning circuit for selecting the unit pixels in a horizontal direction; and
        a vertical scanning circuit for selecting the unit pixels in a vertical direction,
    the DSP chip includes:
        a timing generating circuit for generating timing pulses necessary for operations of the horizontal scanning circuit and the vertical scanning circuit; and
        a digital signal processing circuit for carrying out digital signal processing with respect to the electric signal generated by the plurality of unit pixels,
    the timing generating circuit and the digital signal processing circuit, which are included in the DSP chip, are formed with CMOS transistors, and
    the plurality of unit pixels, the horizontal scanning circuit, and the vertical scanning circuit, which are included in the imaging chip, are formed with transistors of a same conductivity type, at least a part of the horizontal scanning circuit and vertical scanning circuit included being formed with dynamic shift register circuits composed of the transistors of the same conductivity type and capacitors.

2. The imaging device chip set according to claim 1, wherein the plurality of unit pixels, the horizontal scanning circuit, and the vertical scanning circuit, which are included in the imaging chip, are formed with n-MOS transistors.

3. The imaging device chip set according to claim 1, wherein the transistors of the same conductivity type that form the plurality of unit pixels, the horizontal scanning circuit, and the vertical scanning circuit, which are included in the imaging chip, are formed according to a minimum dimension greater than a minimum dimension for forming the CMOS transistors that form the timing generating circuit and the digital signal processing circuit included in the DSP chip.

4. The imaging device chip set according to claim 1, wherein the imaging chip further includes:
   an amplifier circuit for amplifying the electric signal generated by the plurality of unit pixels; and
   an analog-digital converting circuit for converting the electric signal amplified by the amplifier circuit into a digital signal and feeding the digital signal to the digital signal processing circuit included in the DSP chip.

5. The imaging device chip set according to claim 1, wherein the plurality of transistors forming the dynamic shift register circuits are isolated from one another with thick oxide films formed on a substrate.

6. The imaging device chip set according to claim 1, wherein the plurality of transistors forming the dynamic shift register circuits are isolated from one another with ion-implanted layers, the ion-implanted layers being formed so as to be exposed on a surface of a substrate.

7. The imaging device chip set according to claim 1, wherein each of the unit pixels included in the imaging chip includes an embedded-type photodiode that is formed so as to be exposed on a surface of a substrate.

8. An image pickup system comprising:
   the imaging device chip set according to claim 1;
   a memory that stores function information for executing functions including an electronic shutter and an automatic diaphragm; and
   a controller for reading out the function information stored in the memory, and feeding the function information to the DSP chip provided in the imaging device chip set.

* * * * *